US011581451B2

(12) United States Patent
Lin et al.

(10) Patent No.: US 11,581,451 B2
(45) Date of Patent: Feb. 14, 2023

(54) METHOD OF FACILITATING STRAINING OF A SEMICONDUCTOR ELEMENT FOR SEMICONDUCTOR FABRICATION, SEMICONDUCTOR PLATFORM OBTAINED BY THE METHOD, AND OPTOELECTRONIC DEVICE COMPRISING THE SEMICONDUCTOR PLATFORM (71) Applicants: NANYANG TECHNOLOGICAL UNIVERSITY, Singapore (SG); MASSACHUSETTS INSTITUTE OF TECHNOLOGY, Cambridge, MA (US)

(72) Inventors: Yiding Lin, Singapore (SG); Jurgen Michel, Cambridge, MA (US); Chuan Seng Tan, Singapore (SG)

(73) Assignees: NANYANG TECHNOLOGICAL UNIVERSITY, Singapore (SG); MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 0 days.

(21) Appl. No.: 16/621,601

(22) PCT Filed: Jun. 8, 2018

(86) PCT No.: PCT/SG2018/050289
§ 371 (c)(1),
(2) Date: Dec. 11, 2019

(87) PCT Pub. No.: WO2018/231149
PCT Pub. Date: Dec. 20, 2018

(65) Prior Publication Data
US 2020/0105962 A1    Apr. 2, 2020

Related U.S. Application Data (60) Provisional application No. 62/520,906, filed on Jun. 16, 2017.

(51) Int. Cl.
*H01L 31/18* (2006.01)
*H01L 31/0216* (2014.01)
(Continued)

(52) U.S. Cl.
CPC ...... *H01L 31/1808* (2013.01); *H01L 31/0216* (2013.01); *H01L 31/0336* (2013.01); *H01L 33/0054* (2013.01); *H01L 33/44* (2013.01)

(58) Field of Classification Search
CPC ............ H01L 31/1808; H01L 31/0216; H01L 31/0336; H01L 33/0054; H01L 33/44
See application file for complete search history.

(56) References Cited

U.S. PATENT DOCUMENTS 9,780,248 B2 * 10/2017 Huang ................ H01L 31/1075
2010/0207254 A1    8/2010 Jain et al.
(Continued)

FOREIGN PATENT DOCUMENTS

CN    103014847 A    4/2013
CN    203055915 U    7/2013
(Continued)

OTHER PUBLICATIONS

International Search Report dated Aug. 2, 2018 from corresponding PCT Application No. PCT/SG2018/050289.
(Continued)

*Primary Examiner* — Matthew L Reames
(74) *Attorney, Agent, or Firm* — Innovation Capital Law Group, LLP; Vic Lin (57) ABSTRACT

Disclosed is a method of facilitating straining of a semiconductor element (331) for semiconductor fabrication. In a described embodiment, the method comprises: providing a base layer (320) with the semiconductor element (331) arranged on a first base portion (321) of the base layer (320), the semiconductor element (331) being subjected to a strain
(Continued)

relating to a characteristic of the first base portion (321); and adjusting the characteristic of the first base portion (321) to facilitate straining of the semiconductor element (331).

15 Claims, 10 Drawing Sheets

(51) Int. Cl.
    *H01L 31/0336* (2006.01)
    *H01L 33/00* (2010.01)
    *H01L 33/44* (2010.01)

(56) References Cited

U.S. PATENT DOCUMENTS

2013/0039664 A1* 2/2013 Clifton .................. H01S 5/2203
    438/94
2014/0225252 A1 8/2014 Lin et al.

FOREIGN PATENT DOCUMENTS

CN 103794694 A 5/2014
JP H025588 A 1/1990

OTHER PUBLICATIONS

Lin Y., et al., "A self-aligned dry etching method for mechanical strain enhancement of germanium and its uniformity improvement for photonic applications", Silicon PHotonics XII, 22 Gebruary 2018, vol. 10537, pp. 1053704-1-1053704-7.

Ahn, et al., "High performance, waveguide integrated Ge photodetectors," Optics Express, vol. 15, pp. 3916-3921, Apr. 2, 2007 2007.

Arghavani, et al., A. Mascarenhas, and S. E. Thompson, "A Reliable and Manufacturable Method to Induce a Stress of >1 GPa on a P-Channel MOSFET in High vol. Manufacturing," IEEE Electron Device Letters, vol. 27, 2006.

Capellini, et al., "Tensile Ge microstructures for lasing fabricated by means of a silicon complementary metal-oxide-semiconductor process," Opt Express, vol. 22, pp. 399-410, Jan. 13, 2014.

Chu, et al., "Strain: A Solution for Higher Carrier Mobility in Nanoscale MOSFETs," Annual Review of Materials Research, vol. 39, pp. 203-229, 2009.

Ding, et al., "Ge waveguide photodetectors with responsivity roll-off beyond 1620 nm using localized stressor," in OFC/NFOEC, 2012, pp. 1-3.

Feng, et al., "30GHz Ge electro-absorption modulator integrated with 3μm silicon-on-insulator waveguide," Optics Express, vol. 19, pp. 7062-7067, Apr. 11, 2011 2011.

Ghrib, et al., "Tensile-strained germanium microdisks," Applied Physics Letters, vol. 102, p. 221112, 2013.

Ishikawa, et al., "Strain-induced enhancement of near-infrared absorption in Ge epitaxial layers grown on Si substrate," Journal of Applied Physics, vol. 98, p. 013501, 2005.

Jain, A. et al., "A micromachining-based technology for enhancing germanium light emission via tensile strain," Nature Photonics, vol. 6, pp. 398-405, 2012.

Kirchain, et al., "A roadmap for nanophotonics," Nat Photon, vol. 1, pp. 303-305, 06//print 2007.

Lee, et al., "Fabrication and characterization of germanium-on-insulator through epitaxy, bonding, and layer transfer," Journal of Applied Physics, vol. 116, p. 103506, 2014.

Li, et al., "Design considerations of biaxially tensile-strained germanium-on-silicon lasers," Semiconductor Science and Technology, vol. 31, p. 065015, 2016.

Liu, et al., "High-performance, tensile-strained Ge p-i-n photodetectors on a Si platform," Applied Physics Letters, vol. 37, p. 103501, 2005.

Miller, "Optical interconnects to electronic chips," Applied Optics, vol. 49, pp. F59-F70, Sep. 1, 2010 2010.

Saito, et al., "Germanium fin light-emitting diode," Applied Physics Letters, vol. 99, p. 241105, 2011.

Soref, "Group IV photonics: Enabling 2 pm communications," Nature Photonics, vol. 9, pp. 358-359, 2015.

Süess, R. et al., "Analysis of enhanced light emission from highly strained germanium microbridges," Nature Photonics, vol. 7, pp. 466-472, 2013.

Thornton, et al., "Stress-related effects in thin films," Thin Solid Films, vol. 171, pp. 5-31, Apr. 1, 1989 1989.

Van De Walle, "Band lineups and deformation potentials in the model-solid theory," Physical Review B, vol. 39, pp. 1871-1883, 1989.

* cited by examiner

METHOD OF FACILITATING STRAINING OF A SEMICONDUCTOR ELEMENT FOR SEMICONDUCTOR FABRICATION, SEMICONDUCTOR PLATFORM OBTAINED BY THE METHOD, AND OPTOELECTRONIC DEVICE COMPRISING THE SEMICONDUCTOR PLATFORM

TECHNICAL FIELD

The present invention relates to a method of facilitating straining of a semiconductor element for semiconductor fabrication, a semiconductor platform obtained by the method, and an optoelectronic device comprising the semiconductor platform.

BACKGROUND

Germanium (Ge) has been studied extensively for monolithic integration with silicon (Si)-based complementary metal-oxide-semiconductor (CMOS) platforms. Ge is a CMOS-compatible material and has a direct bandgap of approximately 0.8 eV at the Γ-valley, which corresponds to an optical absorption edge of approximately 1550 nm. Ge is thus a suitable candidate material for monolithically-integrated photodetectors for C-band operations. The inherent tensile strain of approximately 0.2% of Ge, resulting from Ge-on-Si epitaxy and subsequent cooling, accounts for a Ge bandgap shrinkage and extends the Ge absorption edge into the L-band. This extension of the absorption edge into the L-band can broaden the bandwidth of the Ge photodetector for fibre-optic communications due to the low loss or attenuation of silica glass fibre in this range. However, the low absorption coefficient of Ge in the L-band results in a low responsivity at a particular material thickness and a constrained device sensitivity. Although the low responsivity may be compensated by increasing the length of the photodetector in a waveguide-integrated scheme, the resultant device capacitance will inevitably be greater, which compromises the high frequency performance of the photodetector.

Figure 1:
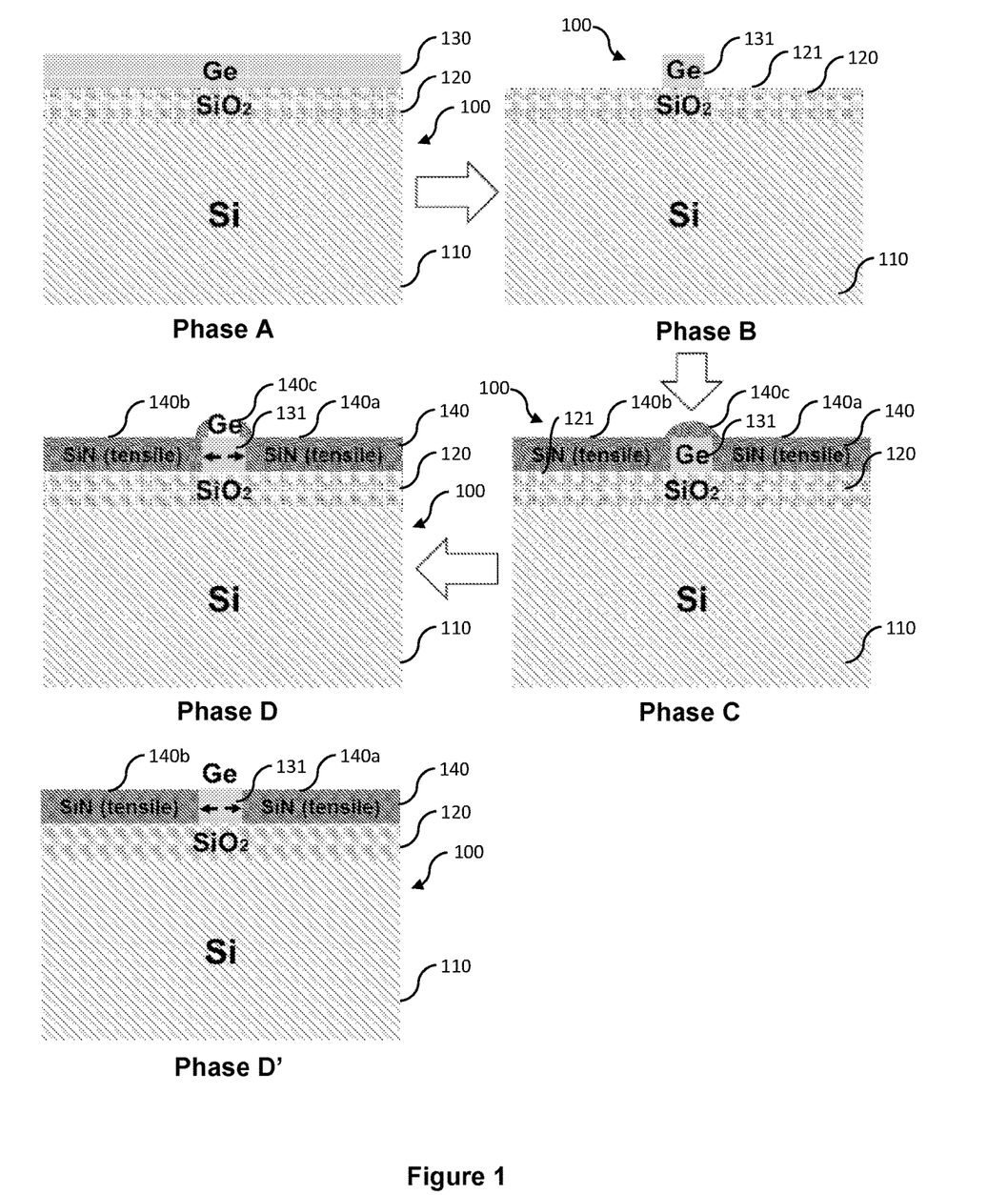
FIG. 1 illustrates cross sectional views of a conventional Ge-on-insulator platform at different phases of tensile strain enhancement.

In order to enhance the absorption coefficient of Ge within and beyond the L-band, a tensile strain of the waveguide can be increased to reduce the direct bandgap. Shown in FIG. 1 is a Ge-on-insulator (GOI) platform 100 at Phases A to D of tensile strain enhancement according to a known method 200 (see FIG. 2). The known method 200 includes Steps 210-240.

Figure 2:
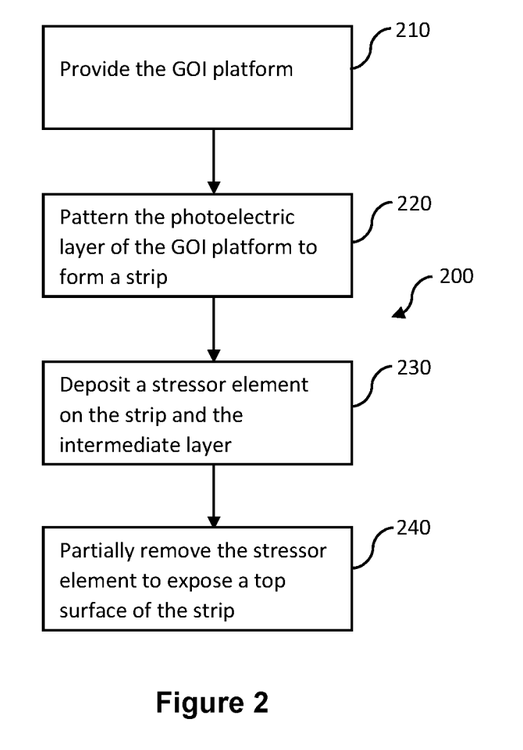
FIG. 2 illustrates a flowchart of a conventional method of straining a photoelectric element in semiconductor fabrication, performed on the platform of FIG. 1.

In Step 210 corresponding to Phase A, the GOI platform 100 is provided and includes a monolithic integration of a substrate layer 110 of Si, an intermediate layer 120 of silicon dioxide ($SiO_2$) arranged on the substrate layer 110, and a photoelectric layer 130 of Ge arranged on the intermediate layer 120.

In Step 220, corresponding to the transition to Phase B, the photoelectric layer 130 of Ge is patterned to form a strip 131, exposing a surface 121 of the intermediate layer 120.

In Step 230 corresponding to the transition to Phase C, a stressor layer 140 of silicon nitride (SiN) is deposited on the GOI platform 100, and includes first, second and third parts 140a-140c. Each of the first and second parts 140a, 140b is deposited on the surface 121 of the intermediate layer 120, and covers a respective side surface of the strip 131. The third part 140c is deposited on and covers a top surface of the strip 131. A stress applied by the first and second parts 140a, 140b on the strip 131 results in a tensile strain of the strip 131.

In Step 240 corresponding to the transition to Phase D, the third part 140c of the stressor layer 140, which is in the shape of a dome, is partially removed to expose the top surface of the strip 131, thereby reducing a compressive strain of the strip 131 attributed to the third part 140c. This can be achieved by dry-etching or chemical mechanical polishing of the third part 140c.

Alternatively, in step 240, the third part 140c may be completely removed through, for example, chemical mechanical polishing (see Phase D' in FIG. 1, alternative to Phase D and following Phase C) to thereby eliminate the compressive strain of the strip 131 attributed to the third part 140c.

A photodetector thus implemented does not exhibit roll-off at 1620 nanometres with more than 0.3% tensile strain induced.

However, this known method 200 has one drawback. The strip 131 of Ge has a non-uniform profile of tensile strain along its depth. Consequently, the strip 131 experiences uneven tensile strain. In some cases, a compressive strain may even be observed near the side surfaces of the strip 131 and proximate to the bottom portion of the strip 131.

A suspended structure has been proposed to mitigate the above problem of strain non-uniformity. However, this approach entails deep wet etching, which is not favoured by CMOS foundries. In addition, the suspended structure also poses difficulties for monolithic integration and packaging, in addition to lowering long term reliability.

It is desirable to provide a method of facilitating straining of a semiconductor element for semiconductor fabrication, a semiconductor platform obtained by the method, and an optoelectronic device comprising the semiconductor platform, which address at least one of the drawbacks of the prior art and/or to provide the public with a useful choice.

SUMMARY

According to one aspect, there is provided a method of facilitating straining of a semiconductor element for semiconductor fabrication, comprising: providing a base layer with the semiconductor element arranged on a first base portion of the base layer, the semiconductor element being subjected to a strain relating to a characteristic of the first base portion; and adjusting the characteristic of the first base portion to facilitate straining of the semiconductor element.

The described embodiment is particularly advantageous. By adjusting the characteristic of the first base portion, the strain experienced by the semiconductor element (i.e., the strain to which the semiconductor element is subjected) can be correspondingly adjusted to facilitate the straining of the semiconductor element, allowing a more uniform strain profile to be achieved when a stressor element is placed on the semiconductor element.

Preferably, the characteristic of the first base portion may include the first base portion experiencing or being subjected to the strain, and adjusting the characteristic may include: removing a second base portion of the base layer to expose the first base portion; and arranging a stressor element on the exposed first base portion to strain the exposed first base portion. With the removal of the second base portion, the stressor element can be arranged to strain the exposed first base portion underneath the semiconductor element. The straining of the first base portion facilitates the straining of a lower portion of the semiconductor element that interfaces with the first base portion. Thus, it is possible to achieve a relatively uniform profile of tensile strain, in comparison with that achievable with the prior art arrangement, when a stressor element is placed on the semiconductor element.

The first base portion may include opposite stress receiving surfaces that are exposed with the removal of the second base portion for arrangement of the stressor element. Preferably, the stress receiving surfaces may be parallel to each other. The stressor element may have a tensile stress of at least about 580 MPa.

Preferably, the characteristic of the first base portion may include an area of contact with the semiconductor element, and adjusting the characteristic includes reducing the area of contact. The first base portion imposes a constraint on straining of the semiconductor element. By reducing the area of contact, this effect of strain constraint can be reduced, achieving a relatively uniform profile of tensile strain in comparison with that achievable with the prior art arrangement, when a stressor element is placed on the semiconductor element. That is, the reduction of the area of contact enhances the straining of the semiconductor element.

The area of contact may be reduced using wet chemical etching.

Preferably, providing the base layer may include patterning a semiconductor layer arranged on the base layer into the semiconductor element. The photoelectric layer may be patterned into the semiconductor element using a first reactive-ion etching (RIE) process. The first RIE process may include the use of a $Cl_2$-based gas.

Preferably, in embodiments where the second base portion is removed to expose the first base portion, the second portion of the base layer may be removed using a second RIE process with a hard mask used in the first RIE process. The mask may be self-aligned. The second RIE process may include the use of a $CF_4$-based gas.

Preferably, the semiconductor element may include a photoelectric element. The semiconductor element may include germanium, and preferably, the semiconductor element may be in the form of a strip.

According to another aspect, there is provided a semiconductor platform obtained by the method.

According to another aspect, there is provided an optoelectronic device comprising the semiconductor platform. Preferably, the optoelectronic device is one of a laser, a modulator and a photodetector.

It is envisaged that features relating to one aspect may be applicable to the other aspects.

BRIEF DESCRIPTION OF THE DRAWINGS

Example embodiments will now be described hereinafter with reference to the accompanying drawings, wherein like parts are denoted by like reference numerals. Among the drawings.

DETAILED DESCRIPTION

Figure 3:
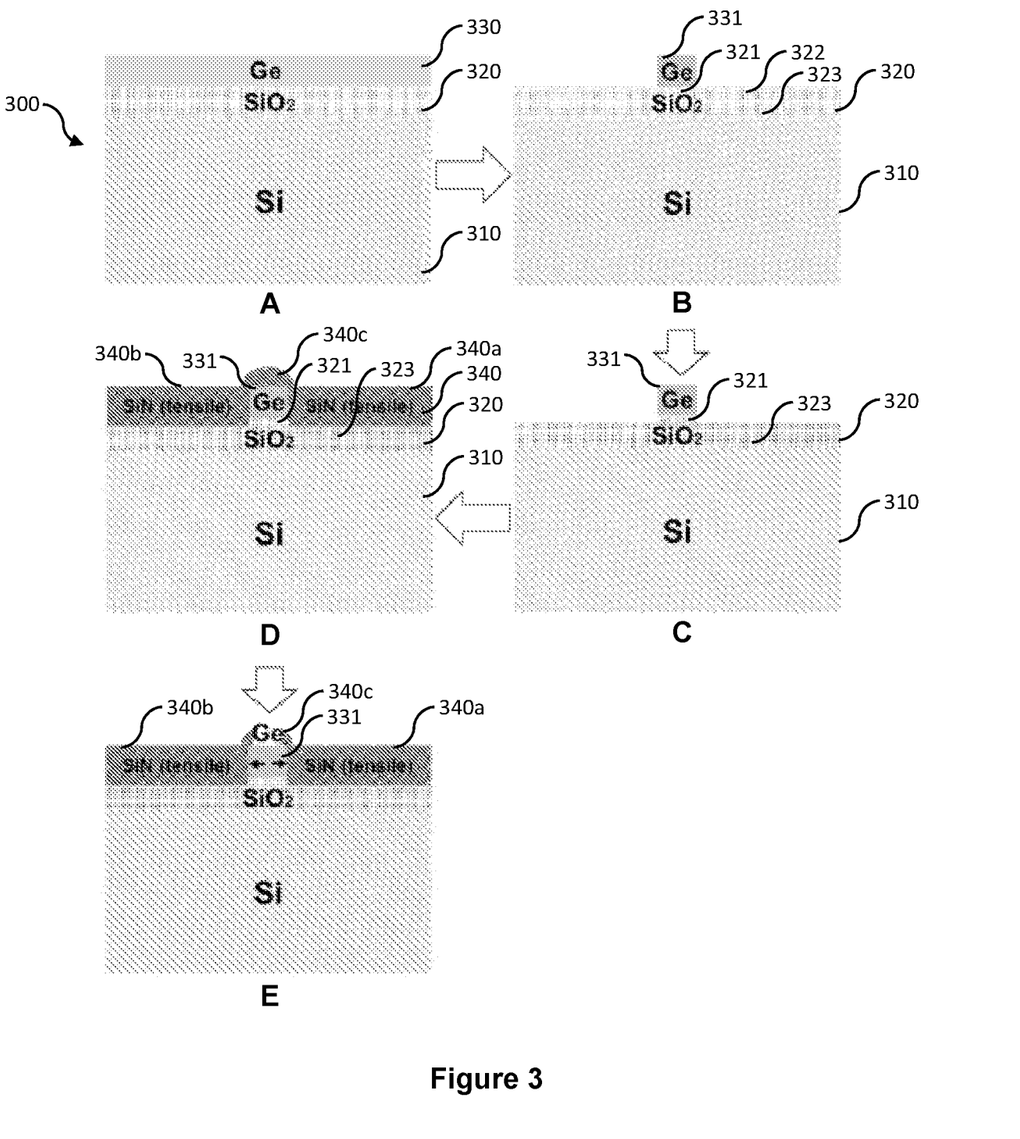
FIG. 3 illustrates cross sectional views of a Ge-on-insulator platform at different phases of tensile strain enhancement, according to one embodiment.
Figure 4:
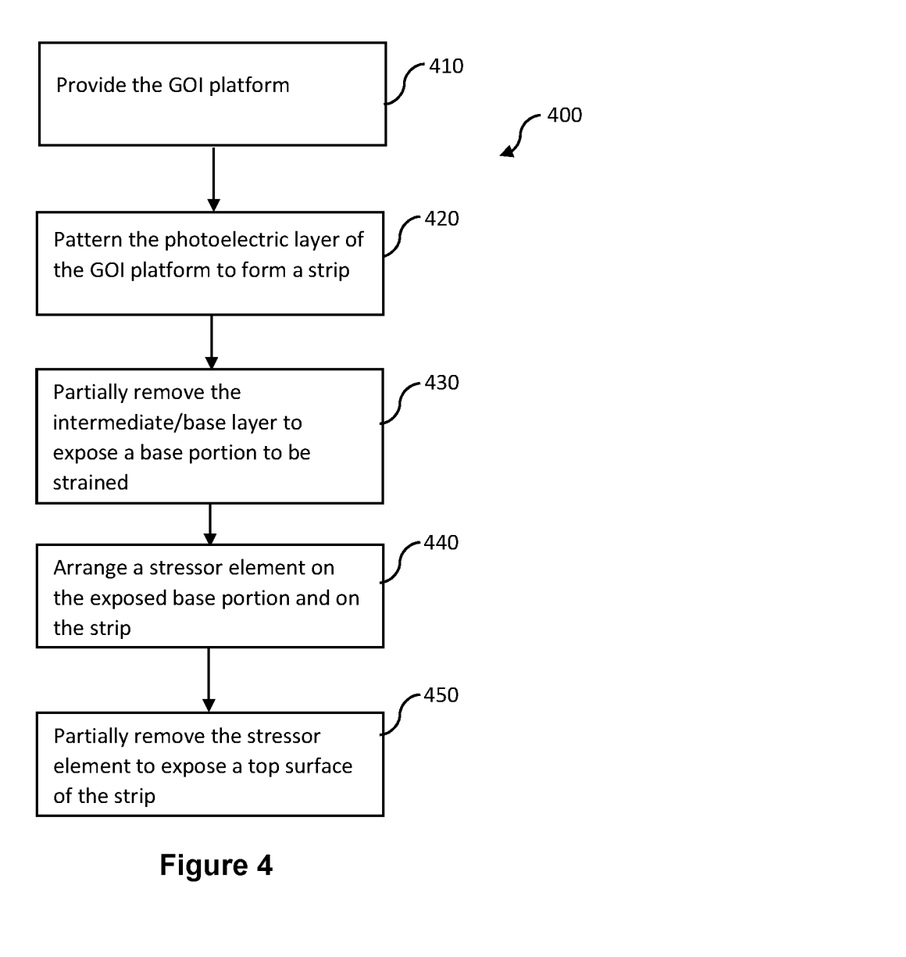
FIG. 4 illustrates a flowchart of a method of facilitating straining of a semiconductor element for semiconductor fabrication, according to one embodiment and performed on the platform of FIG. 3.

Shown in FIG. 3 are cross sectional views of a Ge-on-insulator (GOI) platform 300 at Phases A to E of tensile strain enhancement performed according to a preferred embodiment of a method 400 (see FIG. 4) of facilitating the straining of a semiconductor element 331 of the platform 300. In this example embodiment, the method 400 is CMOS compatible and includes Steps 410 to 450.

In Step 410 corresponding to Phase A, the GOI platform 300 is provided. The provided GOI platform 300 includes a monolithic integration of a substrate layer 310 of silicon (Si), an intermediate layer 320 of silicon dioxide ($SiO_2$) arranged on the substrate layer 310, and a semiconductor layer 330 of germanium (Ge) arranged on the intermediate layer 320. In this example embodiment, the intermediate layer 320 is a layer of insulator serving as a base layer for arrangement of the semiconductor layer 330 on the base layer. The intermediate layer 320 serves to provide electrical isolation between the substrate layer 310 and the semiconductor layer 330, as well as a lower index cladding for optical mode confinement in the substrate layer 310.

In Step 420 corresponding to the transition to Phase B, the semiconductor layer 330 is patterned into the semiconductor element 331 using a first reactive-ion etching (RIE) process. The first RIE process includes the use of a $Cl_2$-based gas (or pure $Cl_2$ gas). In this embodiment, the semiconductor layer 330 is a photoelectric layer, referred to below as the photoelectric layer 330, and the semiconductor element 331 is a photoelectric element, referred to below as the photoelectric element 331. The photoelectric element 331 takes the form of a strip suitable for the generation of the strain. FIG. 3, Phases B to E, shows a short side of the photoelectric element 331 in the strip form.

Figure 5:
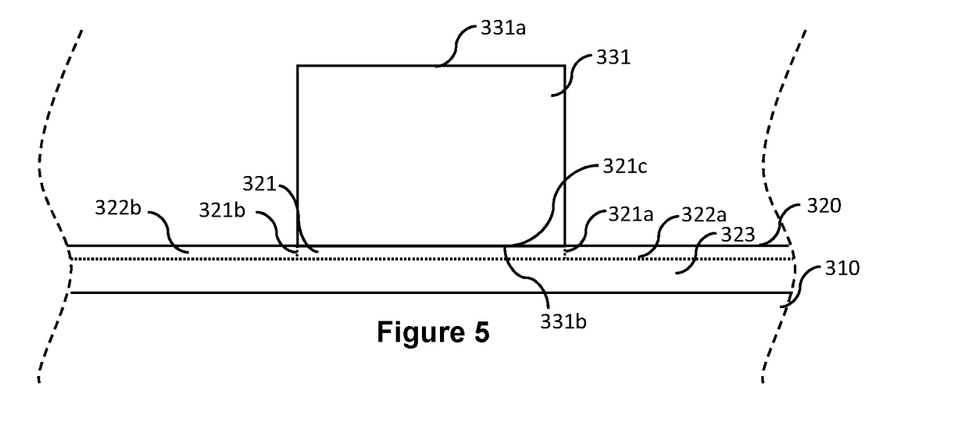
FIGS. 5 to 7 illustrate partially enlarged schematic views of the platform of FIG. 3 at Phases B to D, respectively.

The intermediate layer 320, serving in this embodiment as a base layer for arrangement of the photoelectric element 331, has a first base portion 321, a second base portion 322 and a third base portion 323. The first and second base portions 321, 322 are arranged on the third base portion 323. FIG. 5 shows a partially enlarged schematic representation of the GOI platform 300 at Phase B, with dotted lines marking the logical partitioning of the intermediate layer 320 into the base portions 321-323. Referring to FIG. 5, the photoelectric element 331 is arranged on the first base portion 321. The first base portion 321 defines opposite lateral stress receiving surfaces 321a, 321b parallel to each other, and an upper surface 321c for arrangement of the photoelectric element 331. The second base portion 322 in this embodiment includes first and second sections 322a, 322b connected to the stress receiving surfaces 321a, 321b, respectively. The photoelectric element 331 is arranged on the upper surface 321c of the first base portion 321. The GOI platform 300 is configured such that the photoelectric element 331 experiences or is subjected to a strain which relates to a characteristic of the first base portion 321. In this embodiment, the characteristic is the strain in the first base portion 321. That is, the characteristic of the first base portion 321 includes the first base portion 321 being subjected to a strain that can be exerted on the photoelectric element 331. This relationship between the photoelectric element 331 and the first base portion 321 is described in detail below.

Figure 6:
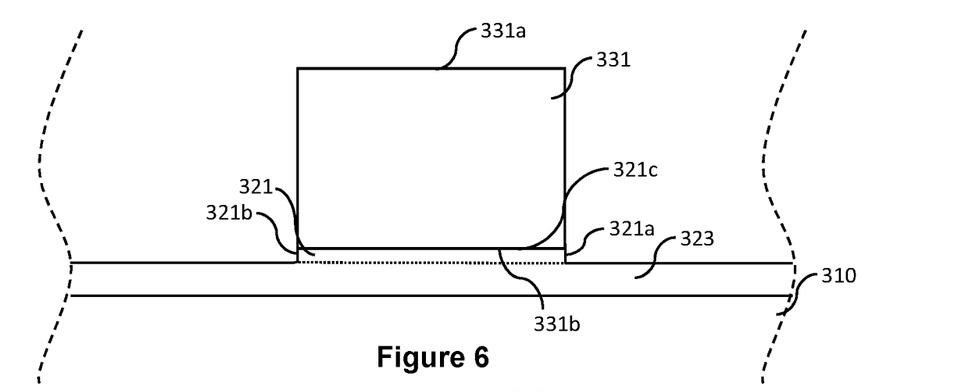

In Step 430 corresponding to the transition to Phase C, the characteristic of the first base portion is adjusted to facilitate straining of the photoelectric element 331. In particular, the second base portion 322 is removed to expose the first base portion 321 and the third base portion 323. FIG. 6 shows a partially enlarged schematic representation of the GOI platform 300 at Phase C. In particular, referring to FIG. 6, the sections 322a, 322b of the second base portion 322 are removed to expose the stress receiving surfaces 321a, 321b of the first base portion 321, respectively, as well as the third base portion 323. The stress receiving surfaces 321a, 321b are thus exposed with the removal of the second base portion 322.

In this embodiment, the second base portion 322 is removed using a second RIE process. A resist used in the first RIE process is used as a self-aligned hard mask in the second RIE process. The second RIE process includes the use of a $CF_4$-based gas (e.g., $CF_4$ gas and $CHF_3$ gas). The second RIE process uses $CHF_3$ and $CF_4$ gases with a reasonable RF power and chamber pressure to ignite both ion bombardment for chemical removal of SiN, leaving a sidewall profile at an angle of approximately 78°. The mask is self-aligned, meaning that the mask is self-aligned in the removal of the second base portion 322 during the second RIE and that no additional lithographic patterning is required, which simplifies the manufacturing process and reduces the cost. In this embodiment, both the resist of the first RIE process and the photoelectric element 331 serve as the mask in removing the second base portion 322, meaning that the second RIE does not need a lithographic patterning process. This provides an advantage in simplicity and cost.

Figure 7:
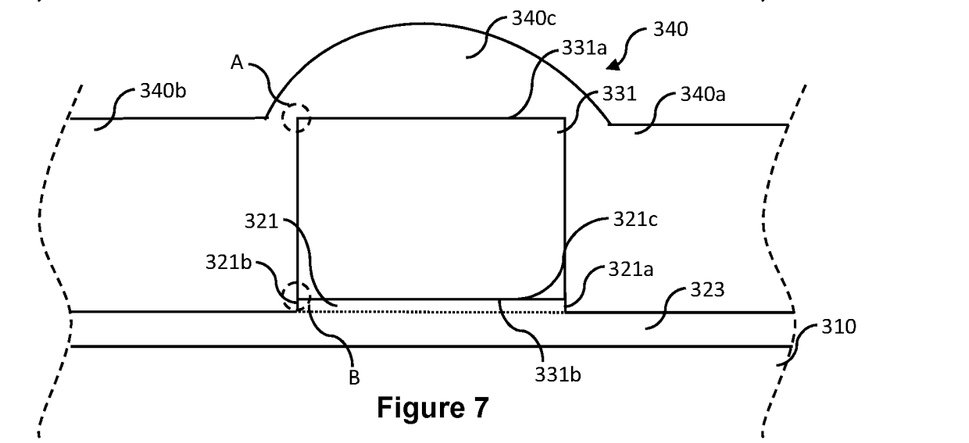

In Step 440 corresponding to the transition to Phase D, a stressor element 340 of silicon nitride (SiN) configured with an intrinsic tensile stress of at least about 580 MPa is arranged on the exposed first base portion 321 and the exposed third base portion 323. In finite element modelling, the intrinsic tensile stress of the stressor element 340 is calculated to be about 1 GPa or 1000 MPa. The first base portion 321 is thus strained by the stressor element 340. FIG. 7 shows a partially enlarged schematic representation of the GOI platform 300 at Phase D. Referring to FIG. 7, the stressor element 340 includes first and second stressor parts 340a, 340b. It can be seen that the first and second stressor parts 340a, 340b, in addition to being arranged on the photoelectric element 331 to strain the photoelectric element 331, are also arranged on the respective stress receiving surfaces 321a, 321b and the third base portion 323 to impose stress on the first base portion 321 via the respective stress receiving surfaces 321a, 321b. The stressor element 340 further includes a third stressor part 340c covering an upper portion 331a of the photoelectric element 331 (see FIGS. 5 to 7). The third stressor part 340c has a cross section in the shape of a dome.

In Step 450 corresponding to the transition to Phase E, the third part 340c is partially removed using a lithography process followed by another RIE process (similar to the second RIE process) with a $CF_4$-based gas to expose the upper portion 331a of the photoelectric element 331. In another embodiment, the third part 340c is completely removed using a chemical-mechanical planarization process.

In contrast with the prior art as discussed above, the stressor element 340 of the example embodiment, through applying a stress on the first base portion 321 of the base layer 320, causes the first base portion 321 to experience a strain (e.g., a tensile strain). The strain experienced by the first base portion 321 in turn causes or facilitates a lower portion 331b (see FIGS. 5 to 7) of the photoelectric element 331 to experience a corresponding strain. Thus, elastic deformation of the lower portion 331b of the photoelectric element 331 interfacing with the upper surface 321c of the first base portion 321 is facilitated or enabled by the stress applied on the first base portion 321 by the stressor element 340. Enhancements of the tensile strain at or toward the lower portion 331b of the photoelectric element 331 and, consequently, of uniformity of tensile strain along the depth of the photoelectric element 331 are thus achieved. That is, photoelectric element 331 is facilitated to be strained under the influence of the stressor element 340 via the first base portion 321.

Moreover, the straining effect thus achieved is tuneable by, for example, adjusting a height or area of the stress receiving surfaces 321a, 321b without adjusting the intrinsic strain of the stressor element 340. That is to say, to increase the straining effect, a larger second base portion 322 can be removed to expose larger stress receiving surfaces 321a, 321b for receiving stress from the stressor element 340. An increase in the height or area of the stress receiving surfaces 321a, 321b thus results in an increase in strain of the first base portion 321, which results in an increase in strain of the lower portion 331b of the photoelectric element 331.

The GOI platform 300 may also be described as follows. The photoelectric element 331 experiences a first strain profile and the first base portion 321 experiences a second strain profile contributing to the first strain profile. The stressor element 340 is applied to the first base portion 321 in the abovementioned manner to directly influence or affect the second strain profile so as to indirectly influence or affect the first strain profile.

Figure 8:
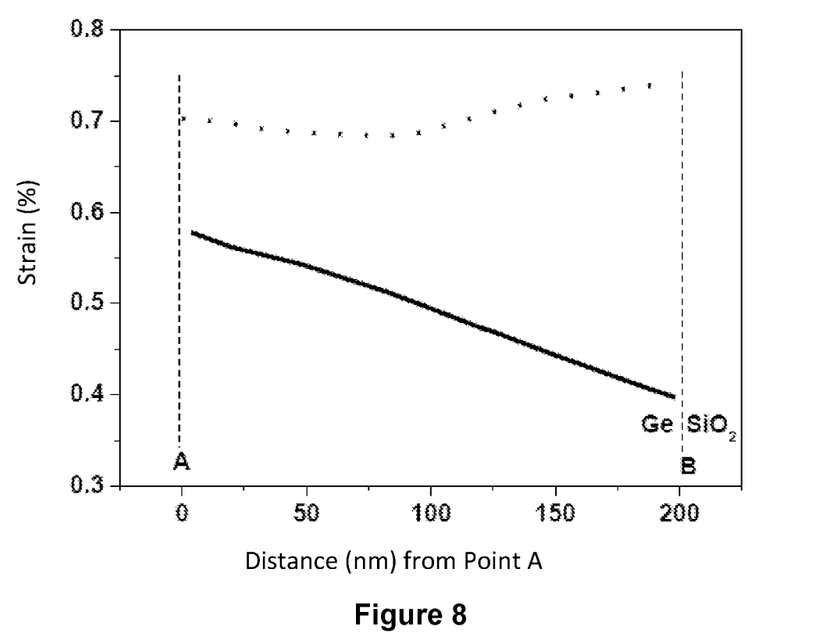
FIG. 8 is a line chart showing uniaxial strain profiles of photoelectric elements of the platforms of FIGS. 1 and 3.

FIG. 8 is a line chart showing uniaxial strain profiles of the photoelectric element 331 of FIG. 3 and the prior art photoelectric element 131 of FIG. 1. The uniaxial strain profiles are shown to be bounded by Points A and B, where Point A corresponds to a point on the photoelectric element 131, 331 distal from the underlying intermediate layer 120, 320, and where Point B corresponds to a point on the photoelectric element 131, 331 proximate to the underlying intermediate layer 120, 320. Points A and B are shown with respect to the cross sectional view in FIG. 7 corresponding to Phase D.

The horizontal axis of the line chart indicates a distance from each point, bounded by Points A and B, to Point A. The vertical axis of the line chart shows a uniaxial strain percentage (%) along the direction of the short side of the element 331 at each point indicated by the horizontal axis. It can be appreciated from the line chart that the photoelectric element 331 has a profile of intrinsic tensile strain, represented by the dotted line, significantly more uniform than that of the prior art photoelectric element 131, represented by the solid line. At Point B, or the junction of the photoelectric element 331 and the first base portion 321, an increase in tensile strain of about 90% can be observed. A reduction in variation of the tensile strain from about 0.36% to about 0.04% can be observed.

Figure 9:
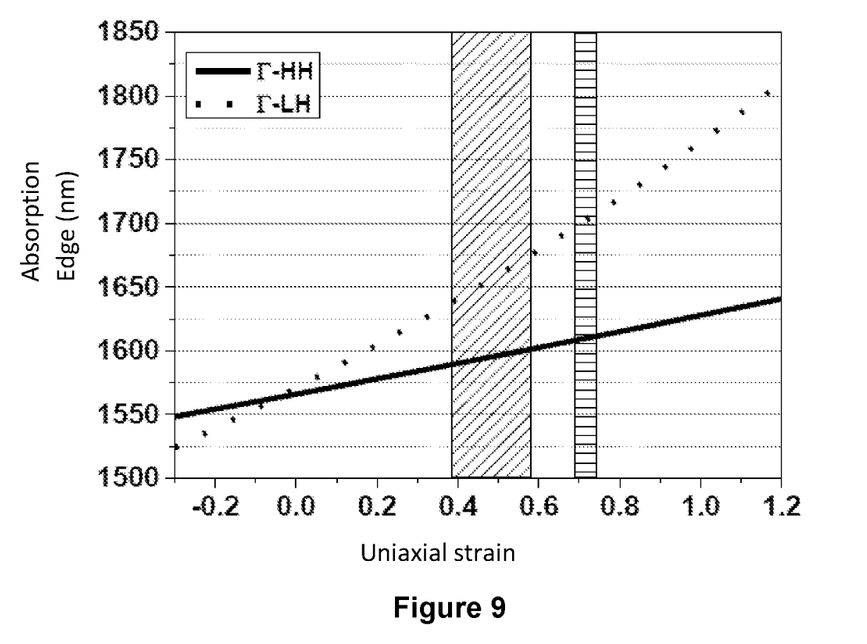
FIG. 9 is a line chart showing theoretically calculated absorption edge profiles of photodetectors implemented respectively using the platforms of FIGS. 1 and 3.

The GOI platform 300 of FIG. 3 has many applications, including waveguide applications. An optoelectronic device (e.g., a laser, a modulator or a photodetector) can be implemented using the GOI platform 300, with the photoelectric element 331 strained according to the manner described above. FIG. 9 is a line chart showing calculated absorption edge profiles of a photodetector implemented using the GOI platform 300. The vertical axis shows absorption edges of the photoelectric element 331 of Ge in nanometres while the horizontal axis shows the uniaxial strain values in the photoelectric element 331. The solid line corresponds to an absorption edge profile between the r-valley conduction band and the split heavy hole (Γ-HH) valence band. The dotted line corresponds to an absorption edge profile between the Γ-valley conduction band and the light hole (Γ-LH) valence band. The shaded area on the left shows the range of uniaxial strain of the photoelectric element 131 of FIG. 1, and the shaded area on the right shows the range of uniaxial strain of the photoelectric element 331 of FIG. 3.

As can be understood from FIG. 9, the absorption edges for the Γ-HH and Γ-LH bands extend toward 1611 nm and 1707 nm, respectively, by virtue of the method 400. The entire L- and U-bands are covered by the Γ-LH band, achieving a widened communication bandwidth comparable with that of an InGaAs-based photodetector in terms of absorption spectrum. The GOI platform 300 is thus suitable for monolithic integration of a completely CMOS-compatible photodetector for optical detection beyond 1.7 micrometres.

Normally, a lattice-matched detector of $In_{0.53}Ga_{0.47}As$ (on InP substrate) has an absorption edge of approximately 1700 nm. However, InGaAs is not a CMOS-compatible material. The GOI platform 300 achieves an absorption edge typical of InGaAs.

The etching processes employed in this embodiment for the purpose of the method 400 are CMOS-compatible dry etching processes. Due to the self-alignment nature of the mask used in the etching processes, the etching processes may be collectively referred to as a "self-aligned dry etching" (SADE) process. The enhancements of magnitude and uniformity of tensile strain of the photoelectric element 331 achieved through the use of the stressor element 340 thus make a photodetector embodying the GOI platform 300 particularly suitable for enhanced and extended photo detection applications. Without the SADE process, the photoelectric element 131 of the conventional GOI platform 100 is not uniformly strained and suffers from lower non-uniform strain magnitudes towards the intermediate layer 120. The SADE method is not limited in application to the making of GOI platforms, and can also be applied to any materials for strain engineering, for example.

Whilst the present example embodiment involves the use of self-aligned dry etching techniques, other techniques (e.g., wet chemical etching and manual removal) may also be used.

Figure 10:
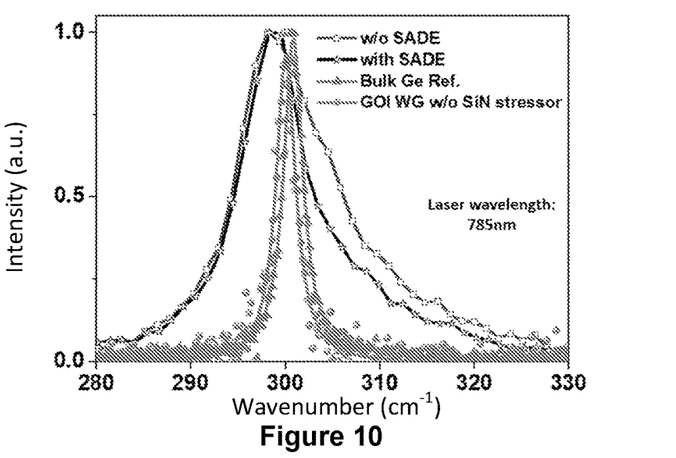
FIG. 10 shows a line chart showing a comparison of the platform of FIG. 3 with that of FIG. 1 and other arrangements, in terms of strain magnitude and uniformity (micro-Raman measurement)

FIG. 10 shows a line chart showing a comparison of the GOI platform 300 with other arrangements in terms of strain magnitude (micro-Raman measurement), where "w/o SADE" corresponds to the known GOI platform 100, "with SADE" corresponds to the GOI platform 300, "Bulk Ge Ref." corresponds to a Ge-only platform, indicating a strain-free reference for the Ge, and "GOI WG w/o SiN Stressor" corresponds to an embodiment of the platform 300 without the stressor element 340. A skilled person would appreciate that the narrower FWHM achieved through the SADE process according to the method 400 indicates a more uniform strain profile.

Figure 11:
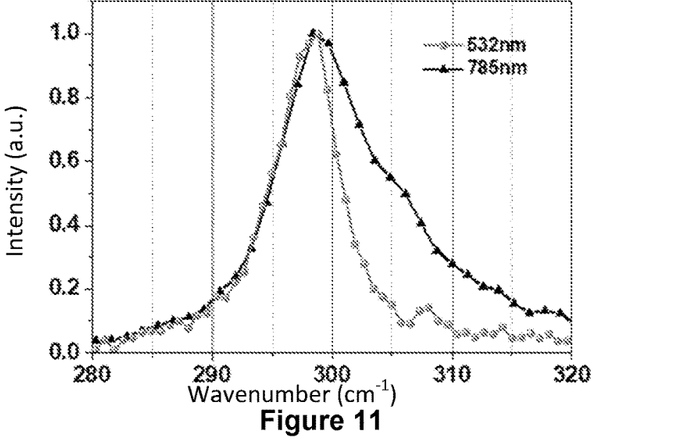
FIG. 11 shows a line chart of strain uniformity and strain distribution, with compressive strain located closer to a bottom portion of the photoelectric element) (micro-Raman measurement) observed in the known platform of FIG. 1.
Figure 12:
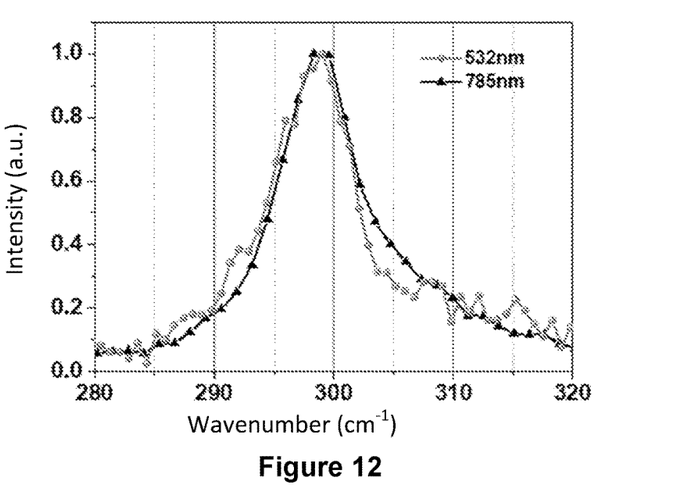
FIG. 12 shows a line chart of strain uniformity and strain distribution (micro-Raman measurement) observed in the platform of FIG. 3.

FIG. 11 shows a line chart of strain uniformity (micro-Raman measurement) observed in the known GOI platform 100 at 532 nanometres and 785 nanometres. FIG. 12 shows a line chart of strain uniformity (micro-Raman measurement) observed in the GOI platform 300 at 532 nanometres and 785 nanometres, showing Raman probing depths of 9 and 89 nanometres at wavelengths of 532 and 785 nanometres, respectively. Strain non-uniformity exhibited by the known GOI platform 100 is indicated by the substantial discrepancy in FIG. 11 between the two curves. In contrast, strain uniformity exhibited by the GOI platform 300 is indicated in FIG. 12 by the substantial overlap between the two curves.

Figure 13:
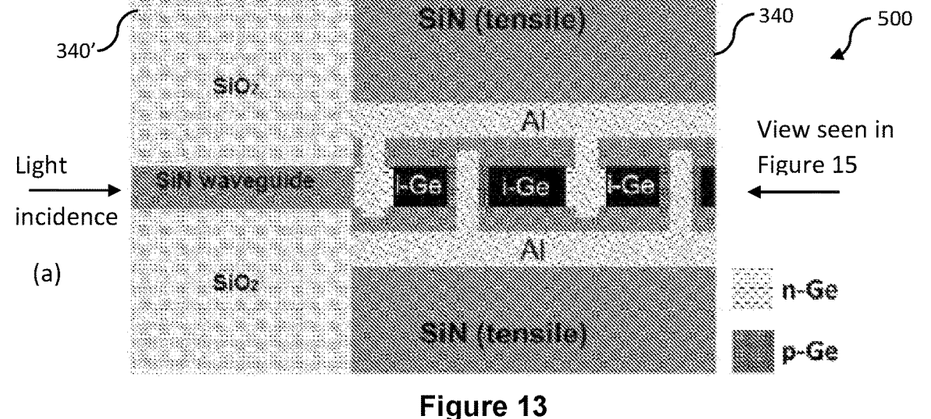
FIG. 13 shows a top schematic view of a photodetector implemented using the platform of FIG. 3.
Figure 14:
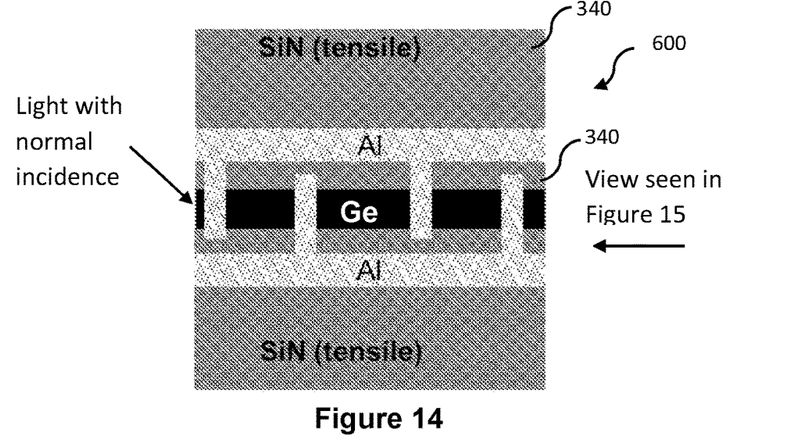
FIG. 14 shows a top schematic view of another photodetector implemented using the platform of FIG. 3.
Figure 15:
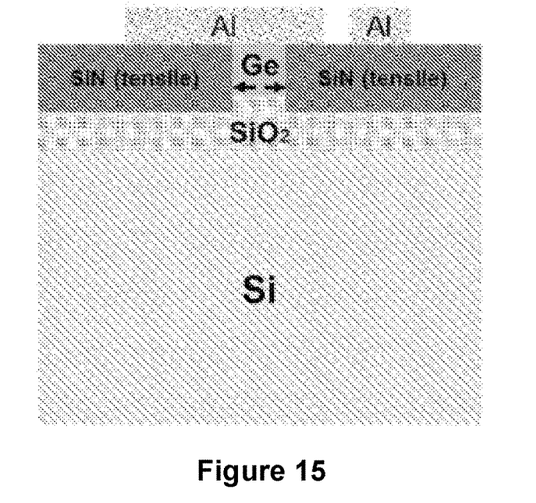
FIG. 15 shows a side view common to the photodetectors of FIG. 13 and FIG. 14.

FIGS. 13 and 14 show top schematic views of respective photodetectors 500, 600 implemented using the GOI platform 300. Each of FIGS. 13 and 14 shows an arrow on the right-hand side. FIG. 15 shows a side view seen from an angle marked by the arrow and common to the photodetectors 500, 600 of FIGS. 13 and 14.

By selectively ion-implanting the photoelectric element 331 of Ge with n-type and p-type dopants followed by a dopant thermal activation, a p-i-n diode configuration is formed. A metal, such as aluminium, is deposited by sputtering and is patterned into an inter-digitated finger format. The stressor element 340' of silicon nitride, marked on the left of FIG. 13, further serves as a waveguide material to guide light into the respective photodetector 500.

The photodetector 600 has a structure similar to that of the photodetector 500 without the p-i-n configuration. The metal in this structure directly contacts the photoelectric element 331 of Ge to form Schottky contacts. The photodetector 600 is simple to fabricate (e.g. no ion-implantation and dopant thermal activation) and achieves a higher quantum efficiency and a faster speed in comparison with the photodetector 500.

Figure 16:
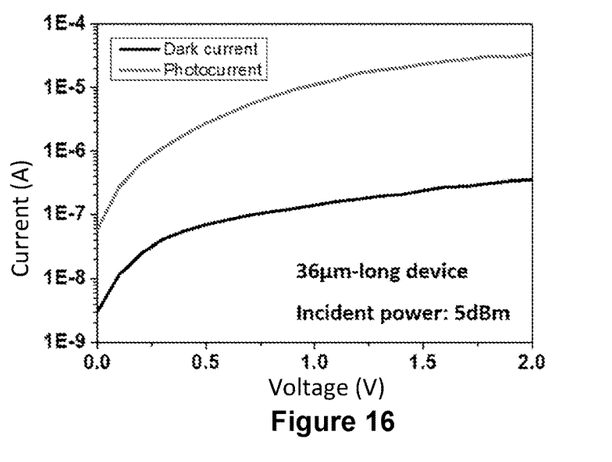
FIG. 16 shows a line chart of current versus voltage obtained using the photodetector of FIG. 14.

FIG. 16 shows a line chart of current versus voltage obtained using the photodetector 600 of FIG. 14. It can be seen that the photodetector 600 implemented using the GOI platform 300 achieves a low dark current and a high photo/dark ratio, indicating a high DC performance.

Figure 17:
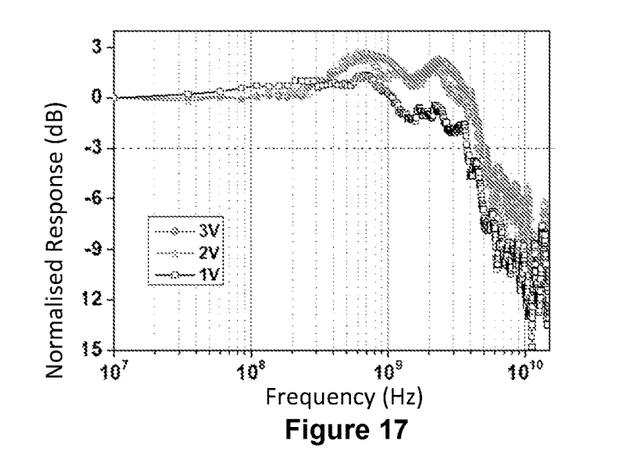
FIG. 17 shows a line chart of normalised detector response vs frequency obtained using the photodetector of FIG. 14.

FIG. 17 shows a line chart of normalised response versus frequency obtained using the photodetector 600 of FIG. 14. It can be understood from FIG. 17 that the photodetector 600 of FIG. 14 can achieve a 3 dB bandwidth of about 3.75 GHz at 1 V and about 5 GHz at 3 V.

Figure 18:
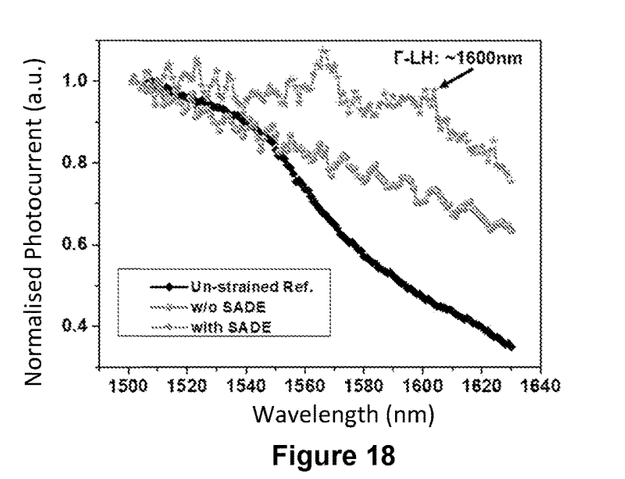
FIG. 18 shows a line chart of normalised photocurrent vs wavelength obtained using the photodetector of FIG. 14 and other arrangements.

FIG. 18 shows a line chart of normalised photocurrent versus wavelength obtained using the photodetector 600 of FIG. 14 and other arrangements. It can be seen that a significantly enhanced photo-response is achieved by the photodetector 600 of FIG. 14 at and beyond the L-band. A skilled person would thus appreciate the method 400 improves photo-response.

Figure 19:
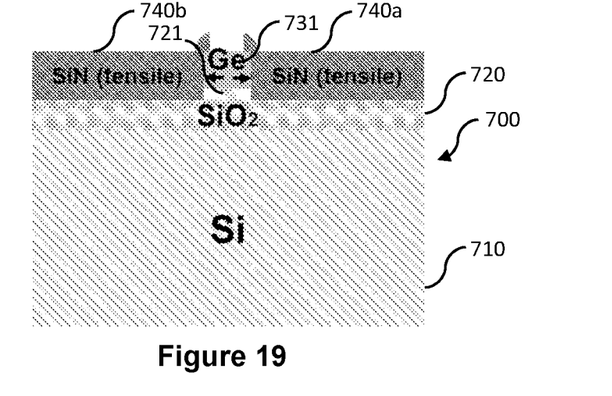
FIG. 19 illustrates a cross sectional view of a Ge-on-insulator platform at a final phase of tensile strain enhancement, according to another embodiment of the present invention.

FIG. 19 shows a cross sectional view of a GOI platform 700 with tensile strain enhanced according to another embodiment of a method 800 (see FIG. 20) of facilitating straining of a semiconductor element 731 of the GOI platform 700. The GOI platform 700 includes a substrate layer 710, an intermediate layer 720, and a semiconductor layer (not labelled) formed into the semiconductor element 731. The intermediate layer 720 includes a first base portion 721 which differs from the first base portion 321 of the GOI 300 in that the first base portion 721 is narrowed and is not in contact with first and second stressor parts 740a, 740b.

A strain experienced by the semiconductor element 731 relates to a characteristic of the first base portion 721 (i.e., the semiconductor element 731 being subjected to a strain relating to the characteristic of the first base portion 721), and the characteristic in this embodiment includes an area of contact of the first base portion 721 with the semiconductor element 731. Further, adjusting the characteristic includes reducing the area of contact.

Figure 20:
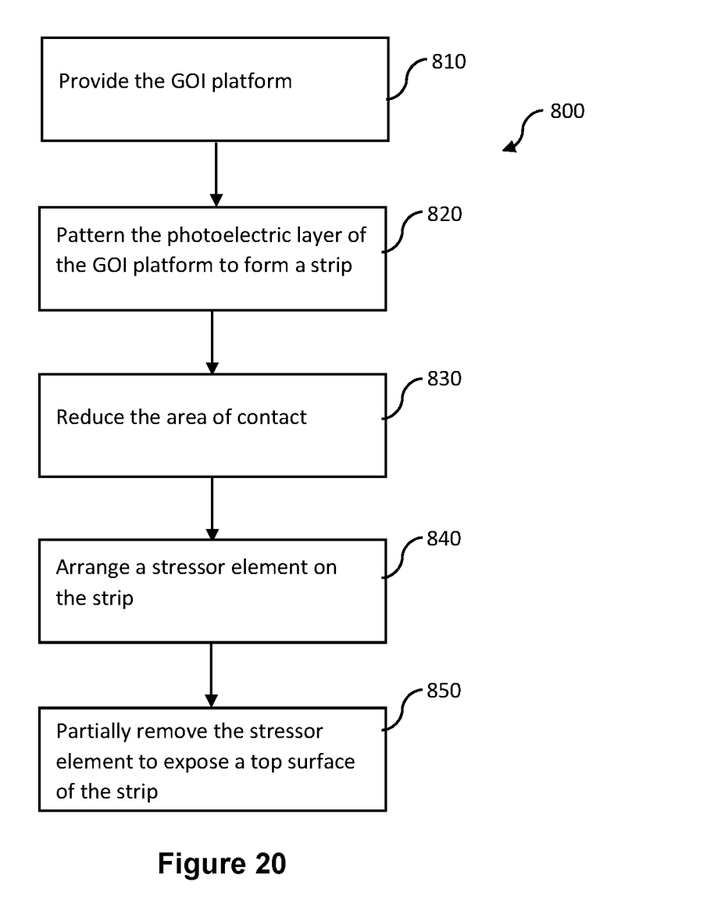
FIG. 20 illustrates a flowchart of a method of facilitating straining of a semiconductor element for semiconductor fabrication, according to another embodiment and performed on the platform of FIG. 19.

The method 800 includes Steps 810 to 850. Steps 810 and 820 are identical to steps 410 and 420, respectively, and, for this reason, are not discussed in detail for the sake of brevity.

In Step 830, the area of contact of the first base portion 721 with the semiconductor element 731 is reduced using wet chemical etching.

In Step 840, a stressor element (not labelled) including the first and second stressor parts 740a, 740b is arranged on the semiconductor element 731 to strain the semiconductor element 731.

As a result of the reduction of area of contact (i.e., step 830), the semiconductor element 731 experiences, from the first base portion 721, a reduced hindrance to strain and thus exhibits a more uniform strain profile along its depth in response to the arrangement of the stressor parts 740a, 740b on the semiconductor element 731 (i.e., step 840). That is, the uniform and enhanced straining of the semiconductor element 731 in Step 840 is facilitated by the reduction of the area of contact in Step 830.

Step 850 is identical to step 450 and, for this reason, is not discussed in detail for the sake of brevity.

It is worth noting that characteristic of the GOI platform 300 and the characteristic of the GOI platform 700 may coexist, meaning that, in a modification of the GOI platform 700, a further stressor element may be arranged on the narrowed first base portion 721 to further facilitate straining of the semiconductor element 731.

In summary, the GOI platform 300 and the method 400 have numerous advantages. The method 400 is simple to perform, is CMOS-compatible, and is compatible with dry etching techniques. Further, the photo detection capability within and beyond the L band is improved, and the optical absorption edge is extended further into longer wavelengths for a wider communication bandwidth and a broader range of applications.

In addition, the method 400 may be applied to various optoelectronic devices, such as electro-absorption (EA) modulators, lasers and LEDs. The extension of the optical absorption edge can broaden the modulation window of EA modulator devices. For on-chip Ge laser designs, the enhanced tensile strain is able to further reduce the energy gap between Γ-valley and L-valley conduction band minimum, achieving a lower laser threshold current density. For on-chip direct-bandgap semiconductor (e.g. III-V compounds) light sources, the enhanced strain (either tensile or compressive) may alter the direct bandgap of the material for wavelength tuning of the light output.

Further, the straining effect of the lower portion 331b of the photoelectric element 331 may be tuned by adjusting the height or area of the stress receiving surfaces 321a, 321b. An adjustment can be made to the area of contact of the first base portion 721 with the semiconductor element 731 to achieve a similar tuning effect. The strain uniformity and hence the absorption edge can be adjusted accordingly with ease.

Furthermore, the method 400 may be applied to preparing any suitable semiconductor element for straining to achieve improvements in, but not limited to, magnitude and uniformity.

Other alternative arrangements are discussed below.

The stressor element 340 may, in other embodiments, be tungsten or aluminium.

The substrate layer 310 may, in other embodiments, be the base layer on which the photoelectric element 330 is arranged. That is, the intermediate layer 320 may be omitted.

In an alternative embodiment of the method 400, the GOI platform 300 provided in step 410 of the method 400 may already include the photoelectric element 331, thereby eliminating the need for Step 420 for patterning the photoelectric layer 330 into the photoelectric element 331.

In an alternative embodiment, instead of completely removing the second base portion 322, the second base portion 322 may be formed with recesses or trenches extending along and exposing the first base portion 321. In this alternative embodiment, the stressor element 340 may be arranged in the recesses or trenches. Indeed, certain steps in the methods 400,800 illustrated in FIGS. 4 and 20 may be optional and omitted, substituted or replaced by other steps, depending on implementation.

The stressor element 340 may alternatively include a compressively-strained stressor material in order to extend the absorption edge towards shorter wavelengths, which broadens the modulation spectrum for EA modulators.

The invention claimed is:

1. A method of straining a semiconductor element for semiconductor fabrication, comprising:
providing a substrate layer and an insulator layer, the insulator layer comprising a first base portion, a second base portion and a third base portion, the third base portion being arranged on the substrate layer, the first and second base portions being arranged on the third base portion, the first base portion having an exposed first surface;
arranging the semiconductor element on the first surface of the first base portion;
removing the second base portion of the insulator layer while retaining the first and third base portions of the insulator layer to thereby expose a side surface of the first base portion and a contact surface of the third base portion; and
arranging a stressor element in contact with the semiconductor element, the side surface of the first base portion, and the contact surface of the third base portion to subject the semiconductor element and the side surface of the first base portion to strain, a first strain profile experienced by the semiconductor element being influenced by a second strain profile experienced by the first base portion.

2. The method of claim 1, wherein removing the second base portion of the insulator layer while retaining the first and third base portions of the insulator layer to thereby expose the side surface of the first base portion and the contact surface of the third base portion includes exposing opposing side surfaces of the first base portion; and
wherein arranging a stressor element in contact with the side surface of the first base portion includes arranging the stressor element in contact with the opposing side surfaces of the first base portion.

3. The method of claim 2, wherein the opposing side surfaces of the first base portion are parallel to each other.

4. The method of claim 1, wherein the stressor element has a tensile stress of at least about 580 MPa.

5. The method of claim 1, wherein arranging the semiconductor element on the first surface of the first base portion comprises arranging a semiconductor layer on the insulator layer and patterning the semiconductor layer into the semiconductor element.

6. The method of claim 5, wherein the semiconductor layer is patterned into the semiconductor element using a first reactive-ion etching (RIE) process.

7. The method of claim 6, wherein the first RIE process includes the use of a C12-based gas.

8. The method of claim 6, wherein the second base portion is removed using a second RIE process with a hard mask used in the first RIE process.

9. The method of claim 5, wherein the second RIE process includes the use of a CF4-based gas.

10. The method of claim 1, wherein the semiconductor element includes a photoelectric element.

11. The method of claim 1, wherein the semiconductor element includes germanium.

12. The method of claim 1, wherein the semiconductor element is in the form of a strip.

13. A method of straining a semiconductor element for semiconductor fabrication, comprising:
providing a substrate layer and an insulator layer, the insulator layer comprising a first base portion, a second base portion and a third base portion, the first and second base portions being arranged on the third base portion, the first base portion having an exposed first surface;
arranging the semiconductor element on the first surface of the first base portion;
removing the second base portion of the insulator layer while retaining the first and third base portions of the insulator layer to thereby expose a side surface of the first base portion and a contact surface of the third base portion;
removing a section of the first base portion at the side surface of the first base portion to form a reduced area of contact between the first surface of the first base portion and the semiconductor element; and
arranging a stressor element in contact with at least the semiconductor element and the contact surface of the third base portion to subject the semiconductor element to strain, a first strain profile experienced by the semiconductor element being influenced by the reduced area of contact between the first surface of the first base portion and the semiconductor element.

14. The method of claim 13, wherein removing the section of the first base portion at the side surface of the first base portion is performed using wet chemical etching of the side surface of the first base portion.

15. The method of claim 13, further comprising arranging a further stressor element in contact with the first base portion.

* * * * *